United States Patent
Yuasa et al.

(10) Patent No.: US 7,522,390 B2
(45) Date of Patent: Apr. 21, 2009

(54) MAGNETORESISTIVE EFFECT ELEMENT, AND MAGNETIC HEAD AND MAGNETIC REPRODUCING APPARATUS INCLUDING THE SAME

(75) Inventors: Hiromi Yuasa, Kawasaki (JP); Hideaki Fukuzawa, Kawasaki (JP); Hitoshi Iwasaki, Yokosuka (JP)

(73) Assignees: Kabushiki Kaisha Toshiba, Tokyo (JP); TDK Corporation, Tokyo (JP)

( * ) Notice: Subject to any disclaimer, the term of this patent is extended or adjusted under 35 U.S.C. 154(b) by 289 days.

(21) Appl. No.: 11/248,203

(22) Filed: Oct. 13, 2005

(65) Prior Publication Data

US 2006/0077595 A1  Apr. 13, 2006

(30) Foreign Application Priority Data

Oct. 13, 2004  (JP)  ............... P2004-298774

(51) Int. Cl.
*G11B 5/39* (2006.01)
(52) U.S. Cl. .................................... 360/324.1
(58) Field of Classification Search .................. None
See application file for complete search history.

(56) References Cited

U.S. PATENT DOCUMENTS

| | | | | |
|---|---|---|---|---|
| 5,715,121 A * | 2/1998 | Sakakima et al. | ......... | 360/324.2 |
| 6,172,859 B1 * | 1/2001 | Watanabe et al. | ......... | 360/327.3 |
| 6,181,537 B1 | 1/2001 | Gill | ......... | 360/324.2 |
| 6,248,416 B1 * | 6/2001 | Lambeth et al. | ......... | 428/832.2 |
| 6,560,077 B2 * | 5/2003 | Fujiwara et al. | ......... | 360/324.1 |
| 6,646,834 B2 | 11/2003 | Sano et al. | ......... | 360/324.11 |
| 6,707,649 B2 | 3/2004 | Hasegawa et al. | ......... | 360/324.12 |
| 6,710,986 B1 | 3/2004 | Sato et al. | ......... | 428/811.1 |
| 7,119,996 B2 * | 10/2006 | Hasegawa et al. | ......... | 360/324.11 |
| 7,123,453 B2 | 10/2006 | Hasegawa et al. | ......... | 360/324.11 |

(Continued)

FOREIGN PATENT DOCUMENTS

EP  1626393  2/2006

(Continued)

OTHER PUBLICATIONS

Nagasaka et al., "Giant Magnetoresistance Properties of Specular Spin Valve Films in a Current Perpendicular to Plane Structure", Journal of Applied Physics, vol. 89, No. 11, Jun. 1, 2001, pp. 6943-6945.

(Continued)

*Primary Examiner*—Mark Blouin
(74) *Attorney, Agent, or Firm*—Nixon & Vanderhye, PC (57) ABSTRACT

A spin-valve magnetoresistive effect film includes a magnetization fixed layer, a magnetization free layer, and an intermediate layer interposed therebetween. The intermediate layer has a conduction part disposed in an insulation layer and made of a magnetic metal material. The ferromagnetic film stacked on an upper side of the intermediate layer, out of ferromagnetic films constituting the magnetization fixed layer and the magnetization free layer has a perpendicular orientation part which is disposed above the conduction part and whose crystal growth direction is substantially perpendicular to a film plane, and a non-perpendicular orientation part which exists in a portion other than the perpendicular orientation part. A magnetoresistive effect element has a pair of electrodes passing a sense current in a direction perpendicular to the film plane of the magnetoresistive effect film.

19 Claims, 8 Drawing Sheets

U.S. PATENT DOCUMENTS

| | | |
|---|---|---|
| 7,218,484 B2 * | 5/2007 | Hashimoto et al. ....... 360/324.1 |
| 7,220,498 B2 | 5/2007 | Nagahama et al. ....... 428/811.1 |
| 7,227,728 B2 | 6/2007 | Lin ........................ 360/324.1 |
| 2002/0048128 A1 | 4/2002 | Kamiguchi et al. ...... 360/324.1 |
| 2002/0051380 A1 | 5/2002 | Kamiguchi et al. |
| 2003/0123200 A1 * | 7/2003 | Nagasaka et al. ........ 360/324.1 |
| 2004/0021990 A1 | 2/2004 | Koui et al. |
| 2004/0042127 A1 | 3/2004 | Hoshiya et al. ............. 360/322 |
| 2004/0086751 A1 * | 5/2004 | Hasegawa et al. ........... 428/692 |
| 2004/0201929 A1 | 10/2004 | Hoshimoto et al. |
| 2004/0246631 A1 | 12/2004 | Dieny et al. .............. 360/324.1 |
| 2005/0111145 A1 | 5/2005 | Yuasa et al. |
| 2005/0168887 A1 | 8/2005 | Yuasa et al. |
| 2005/0201020 A1 | 9/2005 | Fuke et al. |
| 2006/0034022 A1 | 2/2006 | Fukuzawa et al. ........ 360/324.1 |
| 2006/0050444 A1 | 3/2006 | Fukuzawa et al. ........... 360/324 |
| 2006/0056114 A1 | 3/2006 | Fukumoto et al. ........ 360/324.2 |
| 2006/0077595 A1 | 4/2006 | Yuasa et al. .............. 360/324.1 |
| 2006/0077596 A1 | 4/2006 | Yuasa et al. .............. 360/324.1 |
| 2006/0098353 A1 | 5/2006 | Fukuzawa et al. ........ 360/324.1 |
| 2006/0209472 A1 | 9/2006 | Koui et al. ............... 360/324.1 |
| 2007/0091511 A1 | 4/2007 | Hoshiya et al. .......... 360/324.1 |

FOREIGN PATENT DOCUMENTS

| | | |
|---|---|---|
| JP | 2003-204095 | 7/2003 |
| JP | 2004-119534 | 4/2004 |
| JP | 2004-233641 | 8/2004 |
| JP | 2004-257123 | 9/2004 |
| JP | 2004-325315 | 11/2004 |
| JP | 2005-075140 | 3/2005 |
| KR | 10-2006-0050327 | 5/2006 |

OTHER PUBLICATIONS

Takagishi et al., "The Applicability of CPP-GMR Heads for Magnetic Recording", IEEE Transactions on Magnetics, vol. 28, No. 5, pp. 2277-2282.

Claims for U.S. Appl. No. 11/248,296 as of Apr. 16, 2008.

\* cited by examiner

MAGNETORESISTIVE EFFECT ELEMENT, AND MAGNETIC HEAD AND MAGNETIC REPRODUCING APPARATUS INCLUDING THE SAME

CROSS-REFERENCE TO RELATED APPLICATIONS

This application is based upon and claims the benefit of priority from the prior Japanese Patent Application No. 2004-298774, filed on Oct. 13, 2004; the entire contents of which are incorporated herein by reference.

BACKGROUND

1. Field of the Invention

The present invention relates to a magnetoresistive effect element, and a magnetic head and a magnetic reproducing apparatus including the same.

2. Description of the Related Art

In recent years, the development of a magnetoresistive effect element has been progressing. In particular, in accordance with the development of a magnetoresistive effect film exhibiting a giant magnetoresistive effect (GMR), a magnetic device including the same, especially a magnetoresistive effect head (MR head) used as a magnetic head has made a remarkable improvement in its performance.

A spin-valve film is a known example of the GMR film. The spin-valve film has a nonmagnetic layer (called an intermediate layer, a spacer layer, or the like) interposed between two ferromagnetic layers. In such a structure, an exchange bias magnetic field is applied to one of the ferromagnetic layers (called a magnetization fixed layer, a pinned layer, or the like) so as to fix its magnetization, and the magnetization of the other ferromagnetic layer (called a magnetization free layer, a free layer, or the like) is inverted by an external magnetic field such as a signal magnetic field. Then, a relative angle of magnetization directions of the magnetization fixed layer and the magnetization free layer is changed, so that a high magnetoresistive effect can be obtained.

As a GMR element, there has been proposed an element having a so-called CPP (Current Perpendicular to Plane) structure in which a sense current is passed in a direction perpendicular to a film plane of a magnetoresistive effect film. In a spin-valve GMR element, an improvement in a MR change ratio by applying the CPP structure is also expected, and it has been reported that the CPP-GMR element has achieved a MR change ratio about ten times as large as that of a CIP (Current in Plane) GMR element. Further, the CPP-GMR element also has an advantage of having a lower resistance compared with that of a TMR element utilizing a tunnel effect.

In the spin-valve GMR element, the total thickness of spin-dependent layers is very small and the number of interfaces is also small. Therefore, when the CPP structure is applied thereto, the resistance of the element becomes small, resulting in a small output absolute value. A structure under consideration in order to increase the resistance of the element is to connect the magnetization fixed layer and the magnetization free layer by a microscopic conduction part (metal path). It has been known that magnetic coupling between the magnetization fixed layer and the magnetization free layer can be broken even when such a conduction part is made of magnetic metal, if a two-dimensional size of the conduction part is of an atomic order to several nm order (see Phys. Rev. Let. 83, 2425 (1999)). In addition, it has been reported that very large resistance change ratio such as 3000% can be obtained in a joint portion (point contact) made of such a conduction part (see Phys. Rev. B, 66 020403R (2002)).

There are various opinions on why the aforesaid large resistance change ratio is achieved by the point contact, and according to one of the opinions, conductance quantization in the joint portion is thought to be involved. A GMR element utilizing such a point contact structure is disclosed in, for example, Japanese Patent Laid-open Application No. 2003-204095. This patent document describes a spin-valve GMR element in which an insulation layer disposed between a magnetization fixed layer and a magnetization free layer has an opening whose maximum width is 20 nm or smaller, and a ferromagnetic substance is filled in this opening to form a magnetic micro contact. Here, the micro opening is formed in the insulation layer with a needle or the like, and the ferromagnetic substance is deposited on the insulation layer including this opening to form the magnetic micro contact.

The conventional spin-valve GMR element using the point contact structure has a problem that sufficient enhancement of the crystallinity of the conduction part cannot be achieved since the conduction part is formed by filling the ferromagnetic substance in the micro opening formed in the insulating film. This is a factor obstructing the conductance quantization in the conduction part. Further, in the vicinity of the insulation layer (intermediate layer) having the conduction part, a current flows toward the conduction part, and therefore, control over the state of a current path in the ferromagnetic layer including the conduction part is necessary in order to promote the conductance quantization. However, in the conventional spin-valve GMR element with the CPP structure, controlling the state of the current path in the ferromagnetic layer has not been achieved yet.

SUMMARY

It is an object of the present invention to provide a spin-valve GMR element using a point contact structure made of magnetic metal, in particular, a magnetoresistive effect element in which a giant magnetoresistive effect based on point contact is achieved with good reproducibility by promoting conductance quantization in a conduction part, and to provide a magnetic head and a magnetic reproducing apparatus including the magnetoresistive effect element.

A magnetoresistive effect element according to one of the aspects of the present invention includes: a magnetization fixed layer having a ferromagnetic film whose magnetization direction is fixed substantially in one direction; a magnetization free layer having a ferromagnetic film whose magnetization direction changes according to an external magnetic field; an intermediate layer having an insulation layer and a conduction part, the insulation layer being interposed between the magnetization fixed layer and the magnetization free layer, and the conduction part being disposed in the insulation layer so as to connect the magnetization fixed layer and the magnetization free layer and made of a magnetic metal material; and a pair of electrodes arranged so as to pass a sense current in a direction substantially perpendicular to film planes of the magnetization fixed layer, the intermediate layer, and the magnetization free layer, wherein the ferromagnetic film has a perpendicular orientation part and a non-perpendicular orientation part, the perpendicular orientation part being disposed above the conduction part, with crystal growth direction thereof substantially perpendicular to the film plane, and the non-perpendicular orientation part existing in a portion other than the perpendicular orientation part.

A magnetic head according to another aspect of the present invention includes the magnetoresistive effect element according to the above aspect of the present invention. A magnetic reproducing apparatus according to still another aspect of the present invention includes: a magnetic recording medium; and a magnetic head which reads information magnetically recorded on the magnetic recording medium and includes the magnetoresistive effect element according to the above aspect of the present invention.

DETAILED DESCRIPTION

Hereinafter, embodiments of the present invention will be described with reference to the drawings. It should be noted that, though the embodiments of the present invention will be described below based on the drawings, these drawings are presented only for an illustrative purpose and in no way limit the present invention.

Figure 1:
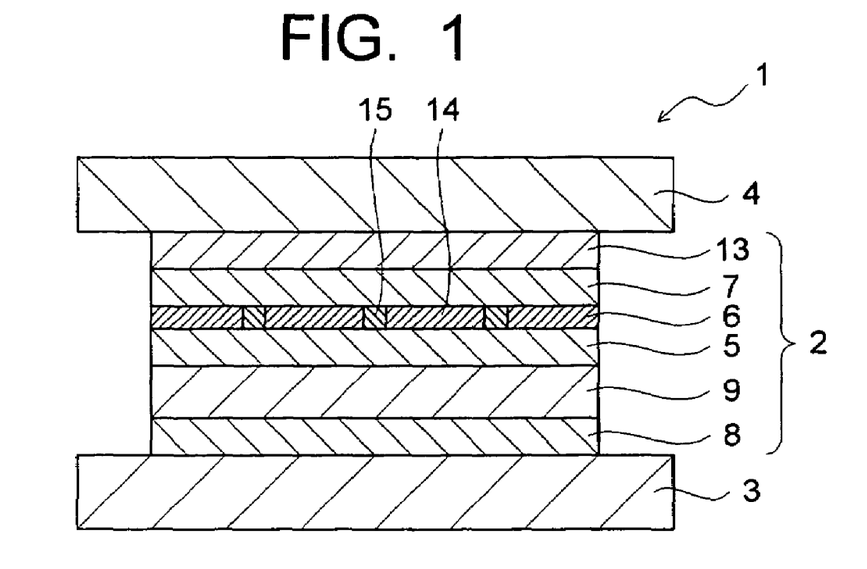
FIG. 1 is a cross-sectional view schematically showing a structure of a magnetoresistive effect element according to an embodiment of the present invention.

FIG. 1 is a cross-sectional view showing a structure of a magnetoresistive effect element according to one embodiment of the present invention. A magnetoresistive effect element 1 shown in FIG. 1 is mainly constituted of a magnetoresistive effect film 2 having a spin-valve structure and a pair of electrodes 3, 4 disposed so as to pass a sense current in a direction substantially perpendicular to a film plane of the spin-valve magnetoresistive effect film 2. The spin-valve magnetoresistive effect film 2 enhances practicability of the magnetoresistive effect element 1.

The spin-valve magnetoresistive effect film 2 has a multilayer film structure of a magnetization fixed layer 5/an intermediate layer 6/a magnetization free layer 7. An antiferromagnetic layer 9 made of a Pt-Mn alloy, an Ir-Mn alloy, or the like is formed on the lower electrode 3 via a under layer 8. A ferromagnetic film constituting the magnetization fixed layer 5 is formed on the antiferromagnetic layer 9. A magnetization direction of this ferromagnetic film is fixed substantially in one direction by an exchange bias magnetic field from the antiferromagnetic layer 9, so that the ferromagnetic film functions as the magnetization fixed layer 5.

Figure 2:
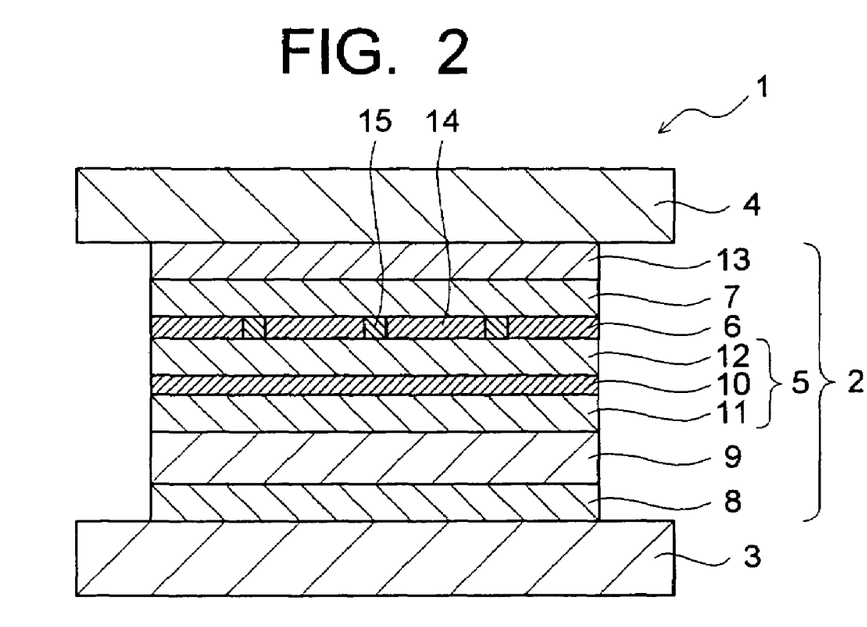
FIG. 2 is a cross-sectional view showing a modification example of the magnetoresistive effect element shown in FIG. 1.

The magnetization fixed layer 5 is not limited to the ferromagnetic film with a single layer structure shown in FIG. 1 but may have a multilayer structure. FIG. 2 shows a magnetization fixed layer 5 made of a multilayer film in which ferromagnetic films 11, 12 are disposed on both sides of a magnetization antiparallel coupling layer 10 made of Ru or the like. In this structure, a magnetization direction of the ferromagnetic film 11 is fixed in one direction by the antiferromagnetic layer 9. Further, the ferromagnetic films 11, 12 are coupled to each other via the magnetization antiparallel coupling layer 10 with the magnetizations thereof being antiparallel. Examples of a material used for the ferromagnetic film constituting the magnetization fixed layer 5 are Fe, Co, Ni, an alloy of these elements, an alloy mainly composed of these elements, and the like.

A ferromagnetic film functioning as the magnetization free layer 7 is formed on the magnetization fixed layer 5 via the intermediate layer 6. A magnetization direction of this ferromagnetic film changes according to an external magnetic field such as a signal magnetic field, so that it functions as the magnetization free layer 7. Examples of a material used for the ferromagnetic film constituting the magnetization free layer 7 are, Fe, Co, Ni, an alloy of these elements, an alloy mainly composed of these elements, and so on, similarly to the magnetization fixed layer 5. Further, the structure of the magnetization free layer 7 is not limited to a single layer structure, either, and a multilayer structure including the ferromagnetic film is applicable. A protective layer 13 is formed on the magnetization free layer 7, and the upper electrode 4 is disposed thereon.

The film thickness of each of the magnetization fixed layer 5 and the magnetization free layer 7, though not limited to a specific value, is preferably, for example, 10 nm or less. Note that the positions of the magnetization fixed layer 5 and the magnetization free layer 7 may be reversed though FIG. 1 and FIG. 2 show the spin-valve magnetoresistive effect films 2 in each of which the magnetization fixed layer 5 is disposed on a lower layer side. That is, it is also possible to adopt a film structure in which the magnetization free layer 7 is disposed on the lower layer side, and the magnetization fixed layer 5 is disposed thereabove via the intermediate layer 6.

Further, the spin-valve magnetoresistive effect film 2 may have a dual spin-valve structure having two intermediate layers.

The intermediate layer 6 interposed between the magnetization fixed layer 5 and the magnetization free layer 7 includes an insulation part 14 and a conduction part 15. The insulation part 14 forms an entire shape of the intermediate layer 6 and is disposed between the magnetization fixed layer 5 and the magnetization free layer 7 in layers. For the insulation part 14, used is a metal oxide, a metal carbide, a metal nitride, or the like whose electric conduction characteristic is insulative. Concrete examples of such chemical compounds are an oxide, a carbide, and a nitride of Al, Ta, Cr, Hf, Mg, Cu, Ca, Ba, Sr, Zr, Li, Ti, Nb, Mo, Si, Y, a rare earth element, and the like.

In the aforesaid insulation part (insulation layer) 14 disposed in layers, one conduction part 15 or more made of a magnetic metal material is(are) disposed so as to connect the magnetization fixed layer 5 and the magnetization free layer 7. Examples used as the magnetic metal material constituting the conduction part 15 are Fe, Co, Ni, an alloy of these elements, an alloy mainly composed of these elements, and the like. Such a conduction part 15 realizes point contact between the magnetization fixed layer 5 and the magnetization free layer 7.

The point contact by the conduction part 15 preferably realizes conductance quantization. The conduction part 15 with conductance quantization made of the magnetic metal material causes the occurrence of ballistic conductance between the magnetization fixed layer 5 and the magnetization free layer 7. Consequently, a new physical phenomenon, namely, a physical phenomenon based on the ballistic conductance is added to the magnetoresistive effect based on a change in the magnetization direction of the magnetization fixed layer 5 and the magnetization free layer 7. This makes it possible to obtain a ballistic magnetoresistive effect (BMR). It is only necessary for the intermediate layer 6 that the conduction part 15 thereof is in contact with the magnetization fixed layer 5 and the magnetization free layer 7, and the conduction part 15 may have a portion extended to an upper and a lower side or to the lower side of the insulation part 14 (a portion arranged in layers or the like).

The number of the conduction parts 15 connecting the magnetization fixed layer 5 and the magnetization free layer 7 is preferably as small as possible, and ideally, the number thereof is one. However, from a viewpoint of obtaining the quantized conduction part 15 with good reproducibility, the conduction parts 15 are disposed in plurality in the insulation layer 14. Specifically, arranging the conduction parts in plurality results in a decrease in the magnetoresistive effect (MR) itself of the magnetoresistive effect element 1. However, even if incomplete quantization occurs in some of the conduction parts 15, the quantization of one of the plural conduction parts 15 can stably provide the giant magnetoresistive effect (BMR) based on the ballistic conductance.

The size of the conduction part 15 (a two-dimensional size of the smallest portion) is preferably, for example, 2 nm or less, and more preferably, 1 nm or less. Too large a size of the conduction part 15 involves a possibility that the conductance quantization is not achieved. Further, the film thickness of the intermediate layer 6 constituted of the insulation part 14 and the conduction part 15 is preferably, for example, 5 nm or less in view of enhancing the formability of the microscopic conduction part 15 and the formability of the point contact by the conduction part 15. The film thickness of the intermediate layer 6 is more preferably 3 nm or less. The film thickness of the intermediate layer 6 is preferably 1 nm or more, considering the formability of a uniform film of an insulating material (insulation part 14).

Figure 3:
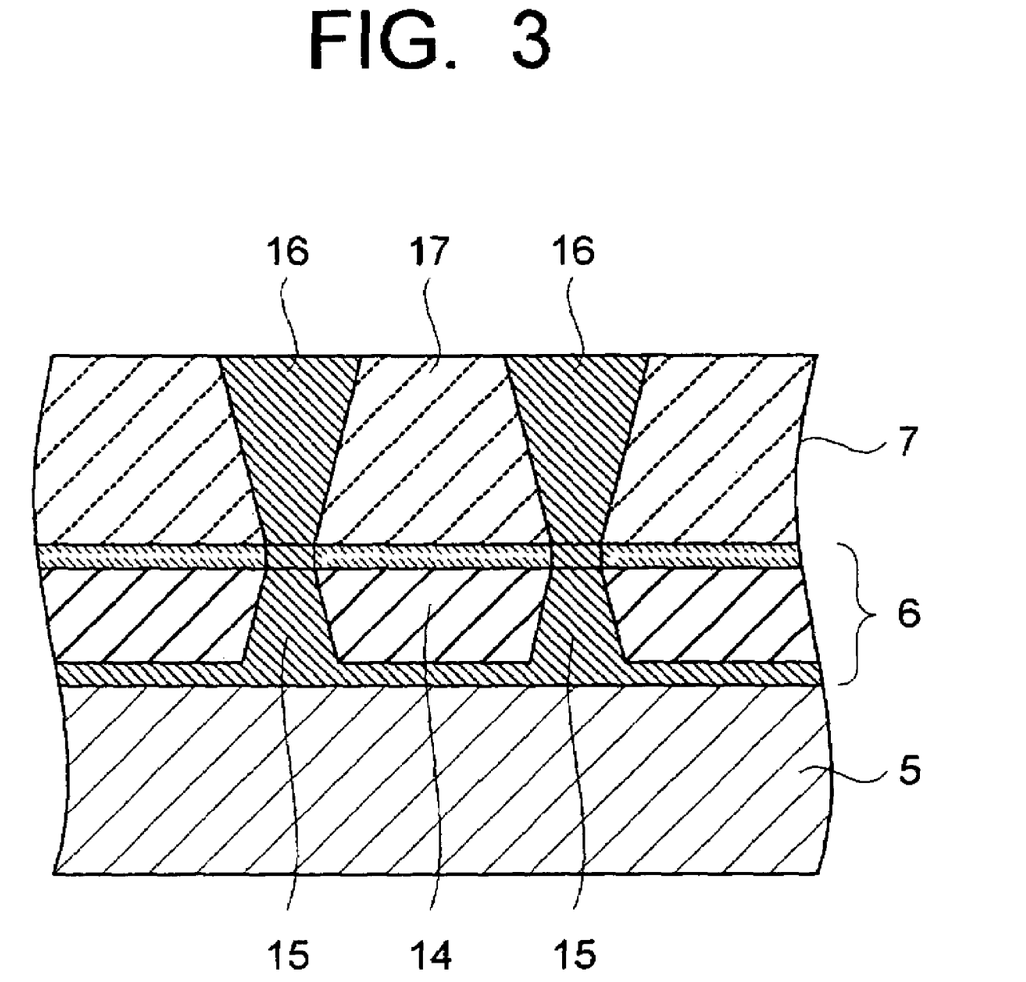
FIG. 3 is an enlarged cross-sectional view of an portion of the magnetoresistive effect element shown in FIG. 1.

The conduction part 15 made of the magnetic metal material is excellent in crystallinity, in other words, it has a state of crystal orientation. A ferromagnetic film functioning as the magnetization free layer 7 is stacked on the intermediate layer 6 including the conduction part 15 whose crystallinity is improved. Crystal growth of the magnetization free layer 7 is continuous above the conduction part 15, so that crystallinity of this portion can be improved. Concretely, the direction of crystal growth can be aligned substantially perpendicular to the film plane. Specifically, as shown in FIG. 3, the ferromagnetic film constituting the magnetization free layer 7 has, in portions positioned above the conduction parts 15, perpendicular orientation parts 16 whose crystal growth direction is substantially perpendicular to the film plane. The direction substantially perpendicular to the film plane means directions within a ±5° range from the direction perpendicular to the film plane, and any direction within this range is allowed as the crystal growth direction of the perpendicular orientation parts 16.

The insulation parts (insulation layer) 14 in the intermediate layer 6 become in an amorphous state. Therefore, portions positioned above the insulation parts 14 in the magnetization free layer 7 become in an amorphous state or a low-crystalline state (in an inferior-quality crystalline state) due to the state of the insulation parts 14. This is true to a case where the extended conduction parts exist between the insulation parts 14 and the magnetization free layer 7. Thus, the portions other than the perpendicular orientation parts 16 in the ferromagnetic film constituting the magnetization free layer 7 are non-perpendicular orientation parts 17 having the amorphous state or the low-crystalline state. Note that the state of the non-perpendicular orientation parts 17 is not limited to the amorphous state or the low-crystalline state, but may be a crystalline state whose orientation direction is different from that of the perpendicular orientation parts 16. Note that the conduction parts 15 shown in FIG. 3 have the portions extended to the upper and lower sides of the insulation parts 14 (layered portions).

As described above, the ferromagnetic film constituting the magnetization free layer 7 has the perpendicular orientation parts 16 existing above the conduction parts 15 and the non-perpendicular orientation parts 17 which exist in the other portions and which is in the amorphous state, the low-crystalline state, the crystalline sate having a different orientation direction from that of the perpendicular orientation parts 16, or the like. Here, the crystallinity quality and crystal growth direction of the conduction parts 15 and the magnetization free layer 7 can be assessed based on whether or not an atomic image is projected when these parts are observed with a cross-section TEM. Specifically, an atomic image of a portion with high crystallinity is clearly projected in the cross-section TEM image, and its crystal growth direction can be determined by further Fourier-transforming this cross-section TEM image. On the other hand, an atomic image of an amorphous portion or a low-crystalline portion is not clearly projected in the cross-section TEM image. Its state can be determined by further Fourier-transforming such a cross-section TEM image.

Figure 4A:
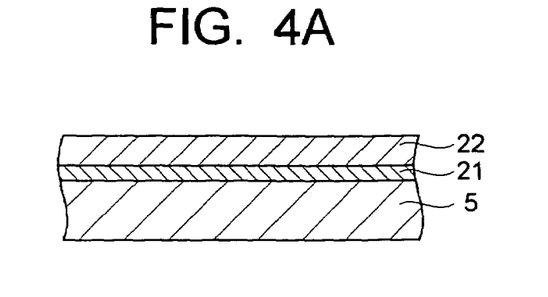
FIG. 4A, FIG. 4B, FIG. 4C, and FIG. 4D are cross-sectional views showing an example of manufacturing processes of a spin-valve magnetoresistive effect film in the magnetoresistive effect element shown in FIG. 1.

The conduction parts 15 and the magnetization free layer 7 having the above-described state can be formed, for example, in the following manner. Manufacturing processes of the conduction parts 15 and the magnetization free layer 7 will be described with reference to FIG. 4A to FIG. 4D. First, as shown in FIG. 4A, a magnetic metal layer 21 such as a Co-Fe alloy layer, which is a formation source of the conduction parts 15, is formed on the magnetization fixed layer 5, and a metal layer 22 such as an Al layer, which is a formation base of the insulation layer 14, is formed thereon.

Figure 4B:
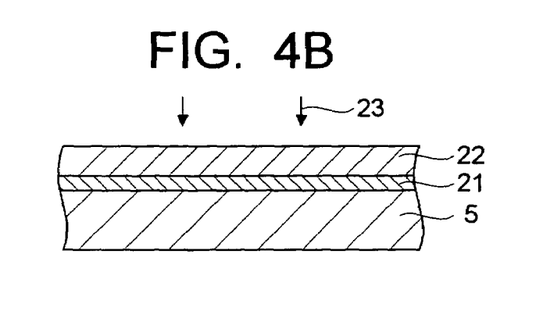

Next, as shown in FIG. 4B, the metal layer 22 as the formation base of the insulation layer 14 is irradiated with ion beams 23, so that nuclei of the conduction parts 15 are produced. The irradiation of the metal layer 22 with the ion beams 23 causes the cohesion of atoms or the like, so that part of the magnetic metal layer 21 positioned on a lower side of the metal layer 22 are absorbed up, so that portions to be the nuclei of the conduction parts 15 are produced. Instead of the irradiation of the ion beams 23, plasma irradiation may be adopted for the process of producing the nuclei of the conduction parts 15. Further, it is also possible to produce the nuclei of the conduction parts 15 with heat assist at 100° C. to 200° C. These kinds of processing may be applied in combination.

Figure 4C:
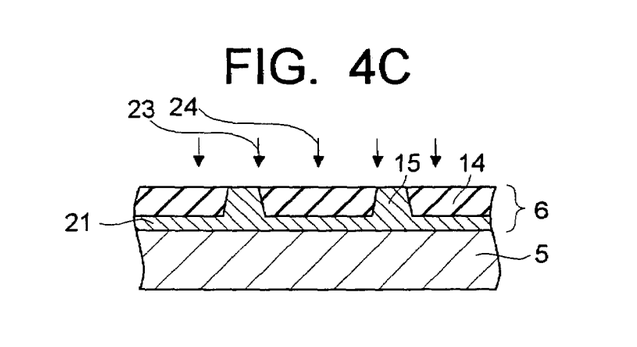

Subsequently, as shown in FIG. 4C, oxygen 24 is introduced along with the irradiation of the ion beams 23 to oxidize the metal layer 22 such as the Al layer, thereby forming the insulation layer 14. By such irradiation of the ion beams 23 in addition to the oxygen 24, the metal layer 22 such as the Al layer is selectively oxidized. Meanwhile, since the magnetic metal layer 21 such as the Co-Fe alloy layer is absorbed upward and at the same time, is reduced, so that the conduction parts 15 made of the magnetic metal material such as the Co-Fe alloy are formed in the insulation layer 14. At this time, crystals of the conduction parts 15 not only grow based on the nuclei produced in the second process but also grow while maintaining good crystallinity owing to the reduction by the ion beams 23. Further, the crystal growth direction thereof becomes substantially perpendicular to the film plane.

Plasma irradiation may be adopted instead of the irradiation of the ion beams 23 in the formation process of the conduction parts 15, as in the nuclei producing process. That is, the simultaneous irradiation of plasma and oxygen also makes it possible to obtain the conduction parts 15 excellent in crystallinity. Further, the exposure to oxygen with heat assist at 100° C. to 200° C. also makes it possible to obtain the conduction parts 15 excellent in crystallinity. Note that the nuclei producing process can be omitted depending on conditions if the heat assist is adopted. Further, the combination of these kinds of processing of the ion beam irradiation, plasma irradiation, and heat assist may be adopted for executing the formation process of the conduction parts 15.

Figure 4D:
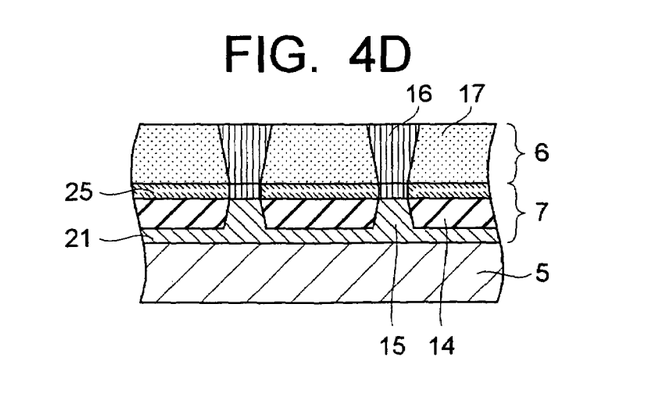

Thereafter, as shown in FIG. 4D, a magnetic metal layer 25 such as a Co-Fe alloy layer to be the extended portions of the conduction parts 15 and the magnetization free layer (ferromagnetic film) 7 are deposited in sequence on the intermediate layer 6 having the conduction parts 15. Note that the formation of the magnetic metal layer 25 may be omitted. Crystal growth of portions positioned above the conduction parts 15 in the magnetization free layer 7 is continuous from the conduction parts 15 excellent in crystallinity, and therefore these portions become the perpendicular orientation parts 16 whose crystal growth direction is perpendicular to the film plane. Portions other than the perpendicular orientation parts 16 become the non-perpendicular orientation parts 17 having the amorphous state or the low-crystalline state due to the amorphous insulation parts 14 as previously described. In this manner, the magnetization free layer 7 having the perpendicular orientation parts 16 and the non-perpendicular orientation parts 17 can be obtained.

Figure 5:
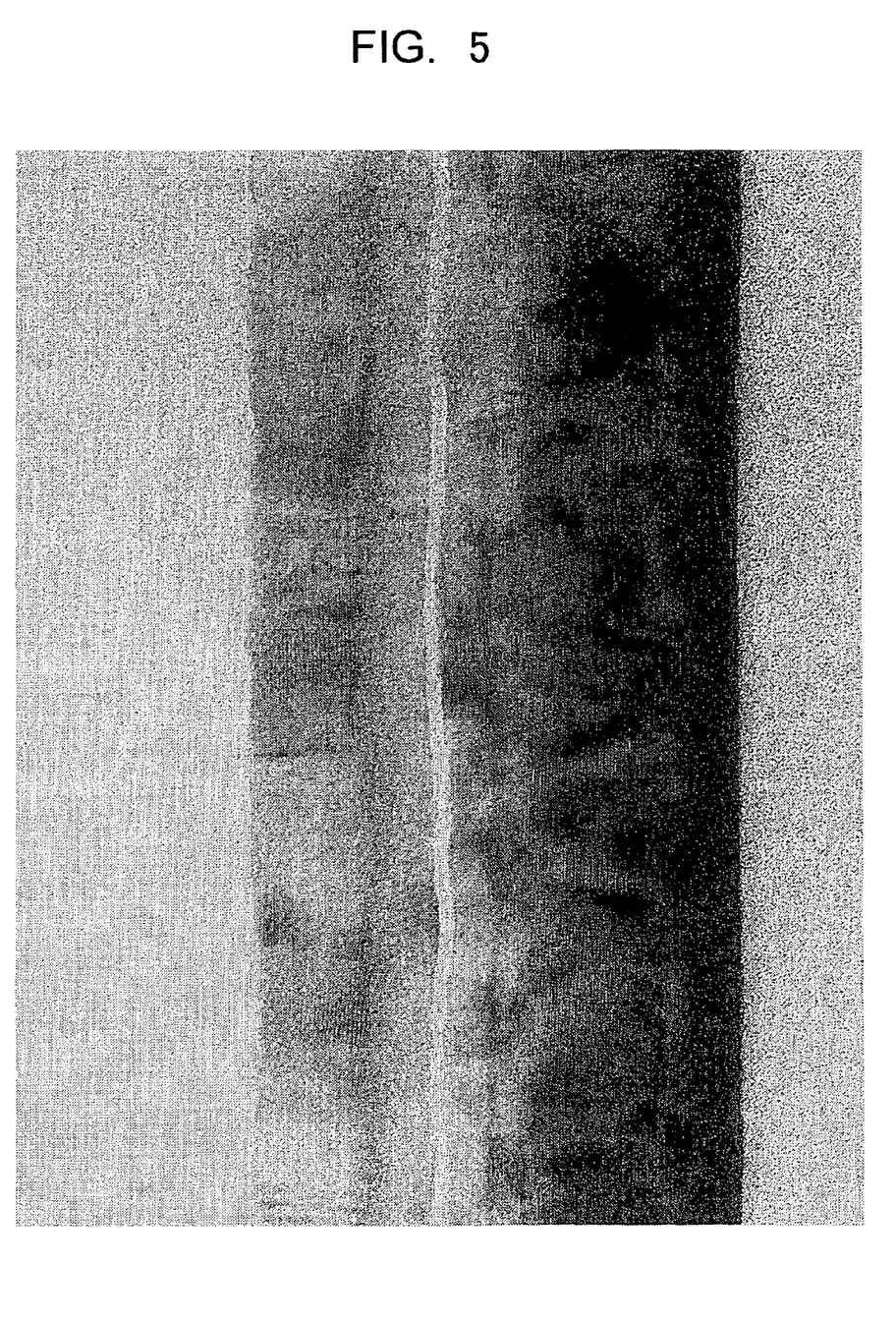
FIG. 5 is a cross-section TEM photograph of a spin-valve magnetoresistive effect film according to an example of the present invention.

FIG. 5 is a cross-section TEM photograph of a spin-valve magnetoresistive effect film 2 according to an example of the present invention. This spin-valve magnetoresistive effect film 2 has an intermediate layer 6 which is formed by oxidizing an Al layer along with the irradiation of ion beams. A concrete film structure of the spin-valve magnetoresistive effect film 2 is as follows. Ta (5 nm)/Ru (2 nm)/PtMn (15 nm)/$Co_{90}Fe_{10}$ (4 nm)/Ru (0.9 nm)/$Co_{90}Fe_{10}$ (4 nm)/Al-O+ $Co_{90}Fe_{10}$ (1.5 nm)/$Co_{90}Fe_{10}$ (1 nm)/$Ni_{80}Fe_{20}$ (3 nm)/Cu(1 nm)/Ta (5 nm). It is seen that perpendicular orientation parts of a magnetization free layer 7 are formed above conduction parts excellent in crystallinity. Further, portions positioned above insulation parts in the magnetization free layer are in an amorphous state or a low-crystalline state. These facts were confirmed by Fourier-transforming the cross-section TEM photograph.

The sense current is passed in the direction perpendicular to the film plane through the spin-valve magnetoresistive effect film 2 having a multilayer film structure of the magnetization fixed layer 5/the intermediate layer 6/the magnetization free layer 7 from the lower electrode 3 and the upper electrode 4 which are provided on an upper side and a lower side thereof. The magnetoresistive effect element 1 exhibits a magnetoresistive effect based on the relative magnetization directions of the magnetization free layer 7 and the magnetization fixed layer 5 when the magnetization direction of the magnetization free layer 7 is changed by an external magnetic field such as a signal magnetic field.

Figure 6:
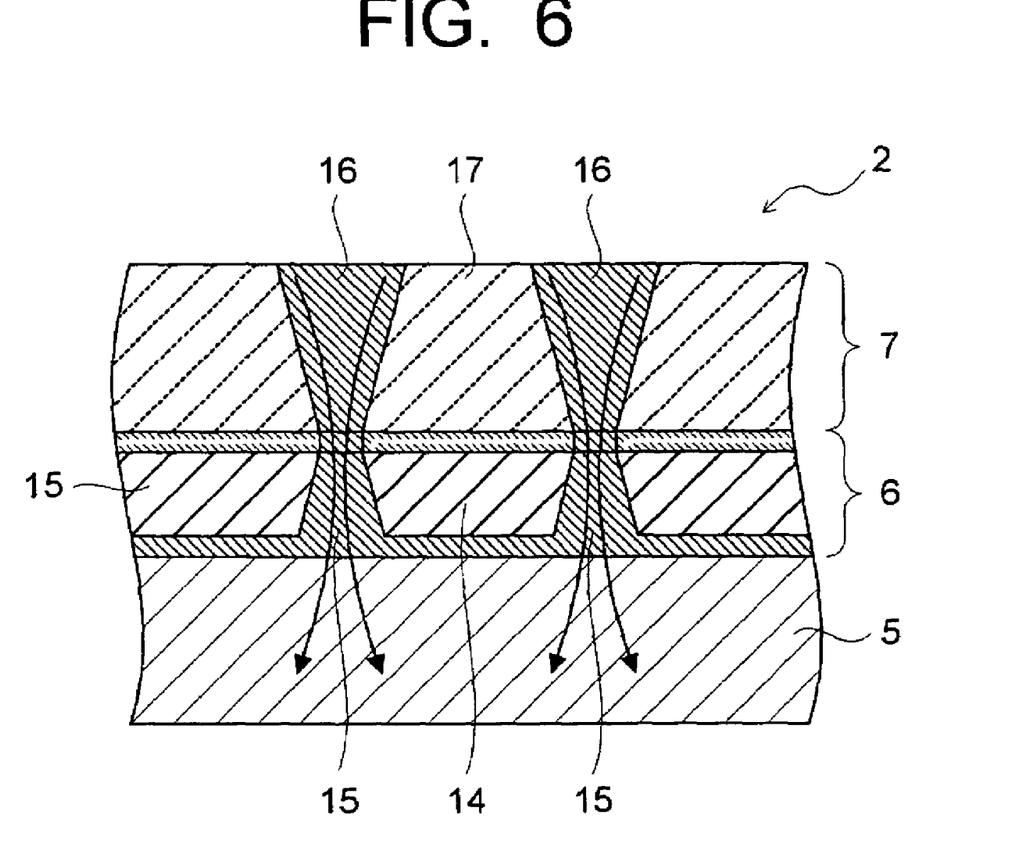
FIG. 6 is a view to illustrate the flow of a sense current in the magnetoresistive effect element shown in FIG. 1.

According to the magnetoresistive effect element 1 as described above, the sense current flows selectively through the perpendicular orientation parts 16 of the magnetization free layer 7, as shown in FIG. 6, in the spin-valve magnetoresistive effect film 2 including the magnetization free layer 7 having the perpendicular orientation parts 16 and the non-perpendicular orientation parts 17. Therefore, a conduction area in the magnetization free layer 7 can be narrowed. This is because a specific resistance of the non-perpendicular orientation parts 17 in the amorphous state, the low-crystalline state, or the like is higher than that of the perpendicular orientation parts 16 excellent in crystallinity.

Figure 7:
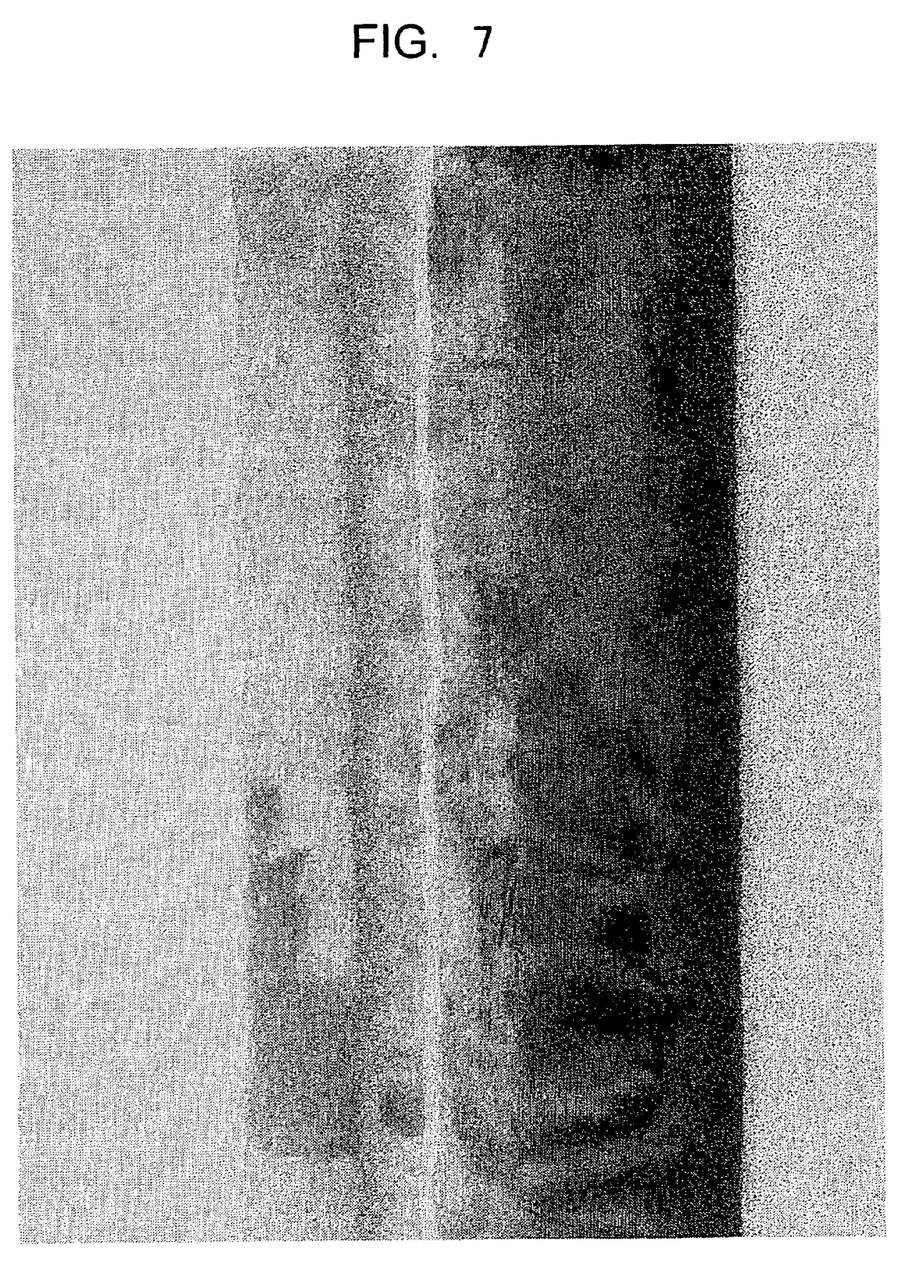
FIG. 7 is a cross-section TEM photograph of a spin-valve magnetoresistive effect film according to a comparative example.

Meanwhile, according to a conventional method of forming a conduction part, a micro opening is formed in an insulation layer such as an Al-O layer with a needle or the like, and a ferromagnetic substance is deposited on the insulation layer including this opening. Therefore, it is not possible to enhance crystallinity of the conduction part, which is made of a magnetic metal material, and a magnetization free layer. That is, the conduction part and the magnetization free layer formed by the conventional method are in an amorphous state or a low-crystalline state. FIG. 7 shows a cross-section TEM photograph of a spin-valve magnetoresistive effect film formed by such a conventional method. Even though conduction parts are formed in an insulation layer, the conduction parts and a magnetization free layer are in an amorphous state or a low-crystalline state. This fact was confirmed by Fourier-transforming the cross-section TEM photograph.

Figure 8:
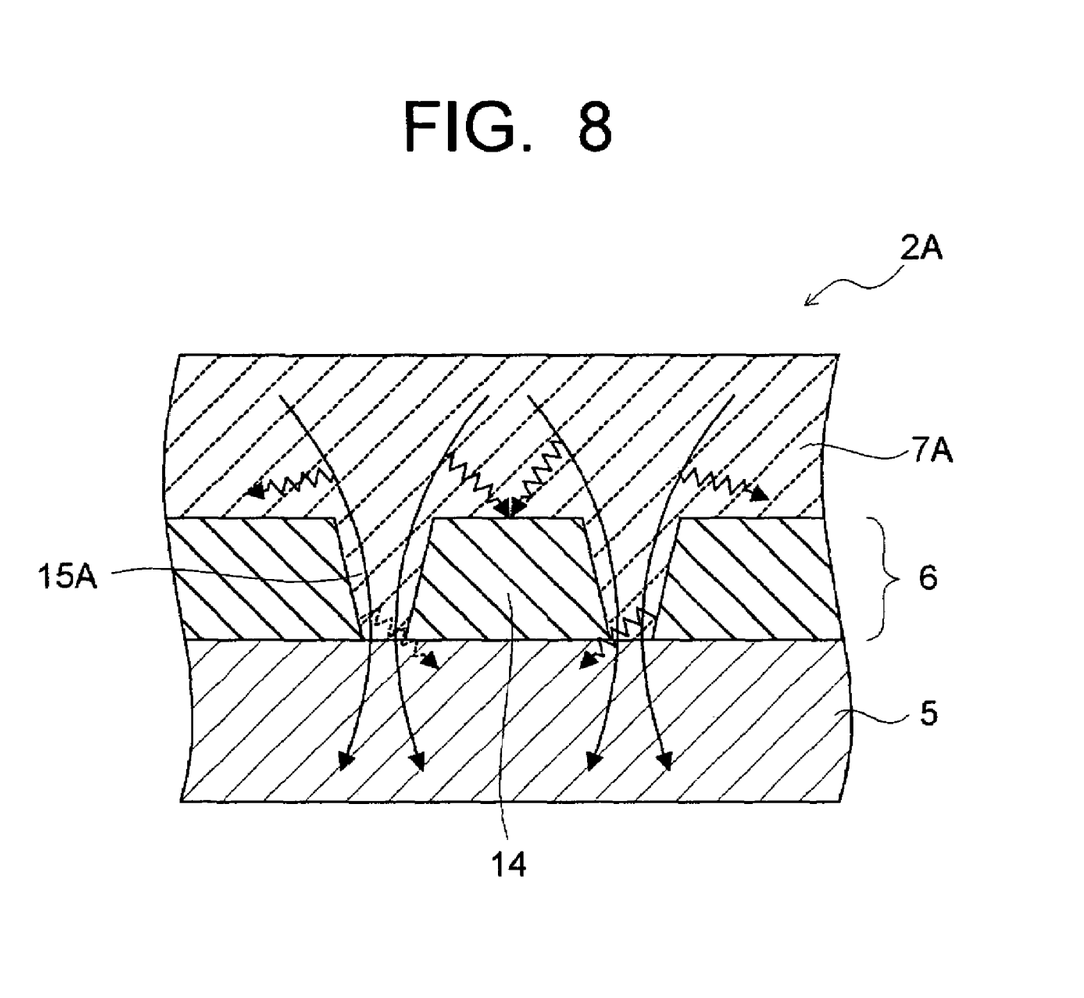
FIG. 8 is a view to illustrate the flow of a sense current in the magnetoresistive effect element according to the comparative example.

FIG. 8 shows the flow of a sense current in the spin-valve magnetoresistive effect film formed by the conventional method. In a conventional spin-valve magnetoresistive effect film 2A shown in FIG. 8, conduction parts 15A are in an amorphous state or a low-crystalline state, and similarly, a magnetization free layer 7A entirely is in an amorphous state or a low-crystalline state. In such a spin-valve magnetoresistive effect film 2A, spin-independent scattering of electrons increases in the magnetization free layer 7A and the conduction parts 15A having the amorphous state or low-crystalline state. Further, there is a high possibility that the conductance quantization does not occur in the amorphous or low-crystalline conduction parts 15A.

A giant magnetoresistive effect (BMR) produced by the quantization in the conduction parts 15 is thought to occur when the ballistic conductance exists, as previously described. The occurrence of non-ballistic conductance, that is, diffusive scattering lowers a magnetoresistive effect (MR) (see, for example, Phys. Rev. B63, 104428 (2001)). Since the conductance quantization occurs in a good-quality crystal system, it can be said that the conduction parts 15 excellent in crystallinity according to the above-described embodiment have a suitable state for the conductance quantization. However, this is not enough to sufficiently enhance reproducibility of the conductance quantization. Therefore, in this embodiment, current paths up to the conduction parts 15 are constituted of the perpendicular orientation parts 16 of the magnetization free layer 7.

Specifically, the flow of the sense current in the magnetization free layer 7 concentrates in the perpendicular orientation parts 16 as described above. Not only because the flow of the current concentrates toward the conduction parts 15 from the perpendicular orientation parts 16 which are narrowed conduction areas, but also because of the excellent crystallinity of the perpendicular orientation parts 16 themselves, it is possible to promote the conductance quantization in the conduction parts 15. Thus realizing the quantization of the conductance between the magnetization fixed layer 5 and the magnetization free layer 7 in the conduction parts 15 makes it possible to increase the magnetoresistive effect (MR ratio) to about ten times as high as that in a conventional crystal system where the diffusive scattering is dominant. Moreover, owing to the excellent crystallinity of the conduction parts 15 and the perpendicular orientation parts 16, spin-independent scattering of electrons can be suppressed in these parts. This also contributes to the improvement in the magnetoresistive effect.

As described above, according to the spin-valve magnetoresistive effect film 2 including the magnetization free layer 7 having the perpendicular orientation parts 16 and the non-perpendicular orientation parts 17, the conductance quantization in the conduction parts 15 made of the magnetic metal material is promoted, so that it is possible to stably obtain the giant magnetoresistive effect (BMR) based on the ballistic conductance. Note that the positions of the magnetization fixed layer 5 and the magnetization free layer 7 may be reversed as previously described, though the description here has been mainly on the structure where the magnetization free layer 7 is disposed on the upper side of the intermediate layer 6. That is, the structure where the magnetization fixed layer 5 is disposed on the upper side of the intermediate layer 6 can also provide the same effect. In this case, adopted is a structure in which the magnetization fixed layer 5 formed on the upper side of the intermediate layer 6 has the perpendicular orientation parts 16 and the non-perpendicular orientation parts 17.

The magnetoresistive effect element 1 of this embodiment is used as a constituent element of a magnetic head and the like similarly to a conventional magnetoresistive effect element. The magnetoresistive effect element 1 is usable as a constituent element not only of the magnetic head but also of a magnetic recording apparatus such as a magnetic memory. The magnetic head including the magnetoresistive effect element 1 of this embodiment is used as a reproducing head for reading information magnetically recorded on a magnetic recording medium. The reproducing head to which the magnetic head of the present invention is applied can be integrated with a recording head for use.

Figure 9:
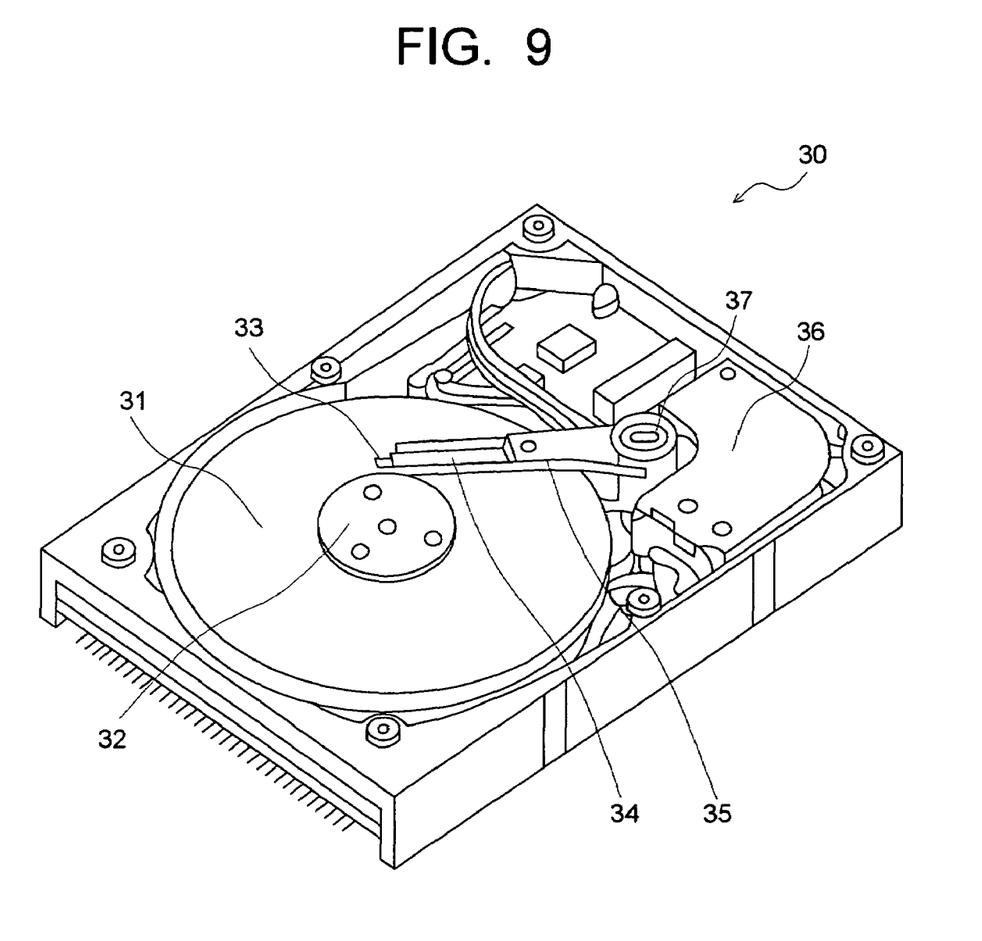
FIG. 9 is a perspective view showing a structure of a magnetic reproducing apparatus according to an embodiment of the present invention.

FIG. 9 is a perspective view showing a configuration of one embodiment in which a magnetic reproducing apparatus of the present invention is applied to a magnetic disk apparatus. A magnetic disk 31 is mounted to a spindle 32 to rotate by a motor (not shown) responding to a control signal. A head slider 33 recording/reproducing information while floating above the magnetic disk 31 is attached at a tip of a suspension 34 in a thin film form. When the magnetic disk 31 rotates, a medium-facing surface (ABS) of the head slider 33 is held with a predetermined floating amount from a surface of the magnetic disk 31. The head slider 33 includes a magnetic head having a reproducing head to which the magnetoresistive effect element 1 of the embodiment described above is applied and a recording head formed integrally with the reproducing head.

The suspension 34 is connected to one end of an actuator arm 35. A voice coil motor 36, which is a kind of a linear motor, is provided at the other end of the actuator arm 35. The voice coil motor 36 is composed of: a driving coil coiled around a bobbin part of the actuator arm 35; and a magnetic circuit composed of a permanent magnet and a counter yoke which face each other across the driving coil. The actuator arm 35 is held by not-shown ball bearings provided at two places in an upper and a lower portion of a fixed shaft 37 and is rotatable/slidable by the voice coil motor 36.

It should be noted that the present invention is not limited to the embodiments described above, but various modifications can be made without departing from the spirit of the present invention when the present invention is embodied. Further, the present invention can be embodied by appropriately combining the embodiments to an allowable extent, which can provide combined effects. Further, the above-described embodiments include inventions on various stages, and by appropriately combining these inventions under a plurality of features that are disclosed, various inventions can be extracted therefrom.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element, comprising:
  a magnetization fixed layer having a ferromagnetic film whose magnetization direction is fixed substantially in one direction;
  a magnetization free layer having a ferromagnetic film whose magnetization direction changes according to an external magnetic field;
  an intermediate layer having an insulation layer and a conduction part, the insulation layer being interposed between the magnetization fixed layer and the magnetization free layer, and the conduction part being disposed in the insulation layer so as to connect the magnetization fixed layer and the magnetization free layer and made of a magnetic metal material; and
  a pair of electrodes arranged so as to pass a sense current in a direction substantially perpendicular to film planes of the magnetization fixed layer, the intermediate layer, and the magnetization free layer,
  wherein the ferromagnetic film stacked on an upper side of the intermediate layer, out of the ferromagnetic films constituting the magnetization fixed layer and the magnetization free layer, has a crystalline perpendicular orientation part and a crystalline non-perpendicular orientation part, the crystalline perpendicular orientation part being disposed above the conduction part, with crystal growth direction thereof substantially perpendicular to the film plane of the intermediate layer, and the crystalline non-perpendicular orientation part existing in a portion other than the crystalline perpendicular orientation part.

2. The magnetoresistive effect element as set forth in claim 1,
  wherein the magnetic metal material constituting the conduction part is mainly made of at least one selected from iron (Fe), cobalt (Co), and nickel (Ni).

3. The magnetoresistive effect element as set forth in claim 1,
  wherein the conduction part has a dimension of 2 nm or less.

4. The magnetoresistive effect element as set forth in claim 1,
  wherein the conduction part realizes point contact between the magnetization fixed layer and the magnetization free layer.

5. The magnetoresistive effect element as set forth in claim 1,
  wherein the insulation layer has a thickness of 5 nm or less.

6. The magnetoresistive effect element as set forth in claim 1,
wherein the insulation layer is arranged between the magnetization fixed layer and the magnetization free layer in layers, and one or more of the conduction part(s) is(are) disposed in the insulation layer.

7. The magnetoresistive effect element as set forth in claim 6,
wherein the conduction parts are disposed in plurality in the insulation layer.

8. The magnetoresistive effect element as set forth in claim 1,
wherein the conduction part has a crystalline state with crystal orientation.

9. The magnetoresistive effect element as set forth in claim 1,
wherein the conduction part has a crystalline state with a crystal growth direction being substantially perpendicular to the film plane.

10. The magnetoresistive effect element as set forth in claim 1,
wherein the crystalline non-perpendicular orientation part has a low-crystalline state or a crystalline state with an orientation direction being different from an orientation direction of the perpendicular orientation part.

11. The magnetoresistive effect element as set forth in claim 1,
wherein the crystalline non-perpendicular orientation part is disposed above the insulation layer with an amorphous state and has a low-crystalline state.

12. The magnetoresistive effect element as set forth in claim 1,
wherein the magnetization free layer is disposed on an upper side of the magnetization fixed layer via the intermediate layer, and the ferromagnetic film constituting the magnetization free layer has the crystalline perpendicular orientation part and the crystalline non-perpendicular orientation part.

13. The magnetoresistive effect element as set forth in claim 1,
wherein the magnetization fixed layer is stacked with an antiferromagnetic layer.

14. A magnetic head comprising the magnetoresistive effect element as set forth in claim 1.

15. A magnetic reproducing apparatus, comprising:
a magnetic recording medium; and
a magnetic head which reads information magnetically recorded on the magnetic recording medium and includes the magnetoresistive effect element as set forth in claim 1.

16. A magnetoresistive effect element, comprising:
a fixed ferromagnetic layer having a magnetization direction that is substantially fixed;
a free ferromagnetic layer having a magnetization direction that changes according to an external magnetic field;
an intermediate layer interposed between the fixed ferromagnetic layer and the free ferromagnetic layer, wherein the intermediate layer includes an insulation layer and one or more metal conduction portions provided so as to connect the fixed ferromagnetic layer and the free ferromagnetic layer; and
a pair of electrodes,
wherein the free ferromagnetic layer includes one or more crystalline non-perpendicular orientation portions and one or more crystallines perpendicular orientation portions provided in correspondence with the one or more conduction portions, a crystal growth direction of the one or more crystalline perpendicular orientation portions being substantially perpendicular to a plane of the intermediate layer.

17. A system comprising a magnetic head that includes the magnetoresistive effect element as set forth in claim 16.

18. A magnetoresistive effect element, comprising:
a fixed ferromagnetic layer having a magnetization direction that is substantially fixed;
a free ferromagnetic layer having a magnetization direction that changes according to an external magnetic field;
an intermediate layer interposed between the fixed ferromagnetic layer and the free ferromagnetic layer, wherein the intermediate layer includes an insulation layer and one or more metal conduction portions provided so as to connect the magnetization fixed layer and the magnetization free layer; and
a pair of electrodes,
wherein the fixed ferromagnetic layer includes one or more crystalline non-perpendicular orientation portions and one or more crystalline perpendicular orientation portions provided in correspondence with the one or more conduction portions, a crystal growth direction of the one or more crystalline perpendicular orientation portions being substantially perpendicular to a plane of the intermediate layer.

19. A system comprising a magnetic head that includes the magnetoresistive effect element as set forth in claim 18.

* * * * *

UNITED STATES PATENT AND TRADEMARK OFFICE
CERTIFICATE OF CORRECTION

PATENT NO. : 7,522,390 B2  Page 1 of 1
APPLICATION NO. : 11/248203
DATED : April 21, 2009
INVENTOR(S) : Yuasa et al.

It is certified that error appears in the above-identified patent and that said Letters Patent is hereby corrected as shown below:

On the cover page, in field (56), References Cited, insert the following list in the OTHER PUBLICATIONS section:

--Fukuzawa et al., MR Ratio Enhancement by NOL Current-Confined-Path Structures in CPP Spin Valves, IEEE Transactions on Magnetics, vol. 40, no. 4, July 2004, pp. 2236-2238.

Fukuzawa et al., Nanoconstricted structure for current-confined path in current-perpendicular-to-plane spin valves with high magnetoresistance, Journal of Applied Physics 97, 10C509 (2005), 3 pages.

Bruno, Geometrically Constrained Magnetic Wall, Physical Review Letters, vol. 83, no. 12, 20 September 1999, pp. 2425-2428.

Chopra et al., Ballistic magnetoresistance over 3000% in Ni nanocontacts at room temperature, Physical Review B 66, 020403(R) (2002), 3 pages.--

Signed and Sealed this

Thirtieth Day of June, 2009

JOHN DOLL
*Acting Director of the United States Patent and Trademark Office*